United States Patent [19]
Kralik

[11] Patent Number: 4,847,838
[45] Date of Patent: Jul. 11, 1989

[54] CIRCUIT FOR TESTING THE BUS STRUCTURE OF A PRINTED WIRING CARD

[75] Inventor: Ivan M. Kralik, Riverside, Ill.

[73] Assignee: AG Communication Systems Corporation, Phoenix, Ariz.

[21] Appl. No.: 64,489

[22] Filed: Jun. 22, 1987

[51] Int. Cl.⁴ .......................................... G01R 31/28
[52] U.S. Cl. ...................................... 371/25; 371/29
[58] Field of Search ...................... 371/24, 25, 27, 29; 324/73 R, 73 AT, 73 PC, 527, 528

[56] References Cited

U.S. PATENT DOCUMENTS

| | | | |
|---|---|---|---|
| 3,633,016 | 1/1972 | Walker et al. | 371/24 |
| 4,176,780 | 12/1979 | Sacher et al. | 371/25 |
| 4,433,414 | 2/1984 | Carey | 371/27 |
| 4,622,669 | 11/1986 | Pri-Tal | 371/25 |

Primary Examiner—Charles E. Atkinson
Attorney, Agent, or Firm—Anthony Miologos

[57] ABSTRACT

This circuit provides for testing the bus structure (address and data buses) of a printed wiring card. This circuit provides an inexpensive means for off line detection of low impedance paths between leads of bus oriented printed wiring cards. This circuit is particularly useful for testing high lead density printed wiring cards, such as, microprocessor or memory related printed wiring cards. This circuit automatically tests all possible combinations of bus leads for a shorted fault condition. This circuit operates without the application of any power to the printed wiring card to be tested. For the detection of any shorted fault leads, the identity of the shorted leads is displayed visually. In addition, for a shorted fault lead, a determination is made as to whether the shorted leads are address bus leads or data bus leads. A visual display indicates whether the particular printed wiring card has successfully passed all the tests 22 Claims, 2 Drawing Sheets

CIRCUIT FOR TESTING THE BUS STRUCTURE OF A PRINTED WIRING CARD

BACKGROUND OF THE INVENTION

The present invention pertains to testing, diagnosing and repairing printed wiring cards and more particularly to testing the bus leads of printed wiring cards which utilize bus structured components.

In the manufacture of complex bus structured printed wiring cards (PWC), the signal leads of each bus are closely spaced and cover a considerable of such printed wiring cards have elaborate bus structures on both sides of the PWC. These bus structures often pass beneath the components of the printed wiring card.

As a result of the wave solder process in the fabrication of printed wiring cards, these buses often contain solder shorts (unintended connection between the signal leads). One previous method of detecting such solder shorts include visual inspection with the aid of high magnification. Another method of detecting the shorts employs an ohm meter to check the resistance between a particular signal lead and every other signal lead to insure that no unintended connections have been made. These manual methods are time consuming and error prone.

Some printed wiring card testing involves the generation of complex computer generated algorithms. The process of generating the software which employs these algorithms is expensive for testing small numbers of various kinds of printed wiring cards.

Accordingly, it is the object of the present invention to provide an inexpensive, quick and relatively error free apparatus for automatically testing the bus structure of various printed wiring cards for electrical shorts.

SUMMARY OF THE INVENTION

In accomplishing the objects of the present invention, there is provided a novel circuit for automatically testing the bus structure of a printed wiring card for electrical shorts.

This circuitry for testing the bus structure of a printed wiring card includes a pattern generator which is cyclically operated to produce pluralities of logic values for each lead of an address bus and a data bus. These address and data buses correspond to the bus structure of the printed wiring card which is to be tested.

This circuitry also includes a memory scheme which is connected to the pattern generator via address and data bus leads. This memory scheme is operated to store two copies of the pluralities of logic values produced by the pattern generator. The values of the data bus are stored at a location in the memory scheme corresponding to the values of the address bus. A connection arrangement connects the address and data bus structure of the printed wiring card undergoing test to the address bus and data bus leads of the memory scheme. This connection arrangement permits the logic values of the address and data buses of any shorted leads of the bus structure of the printed wiring card to affect the address bus connected to the memory scheme.

Lastly, a detection circuit is connected to the pattern generator and to the memory scheme. This detection circuit operates to compare the two stored copies of logic values and to indicate the identity of any faulty leads of the bus structure of the printed wiring card based upon an analysis of the memory contents.

DESCRIPTION OF THE PREFERRED EMBODIMENT

Figure 1:
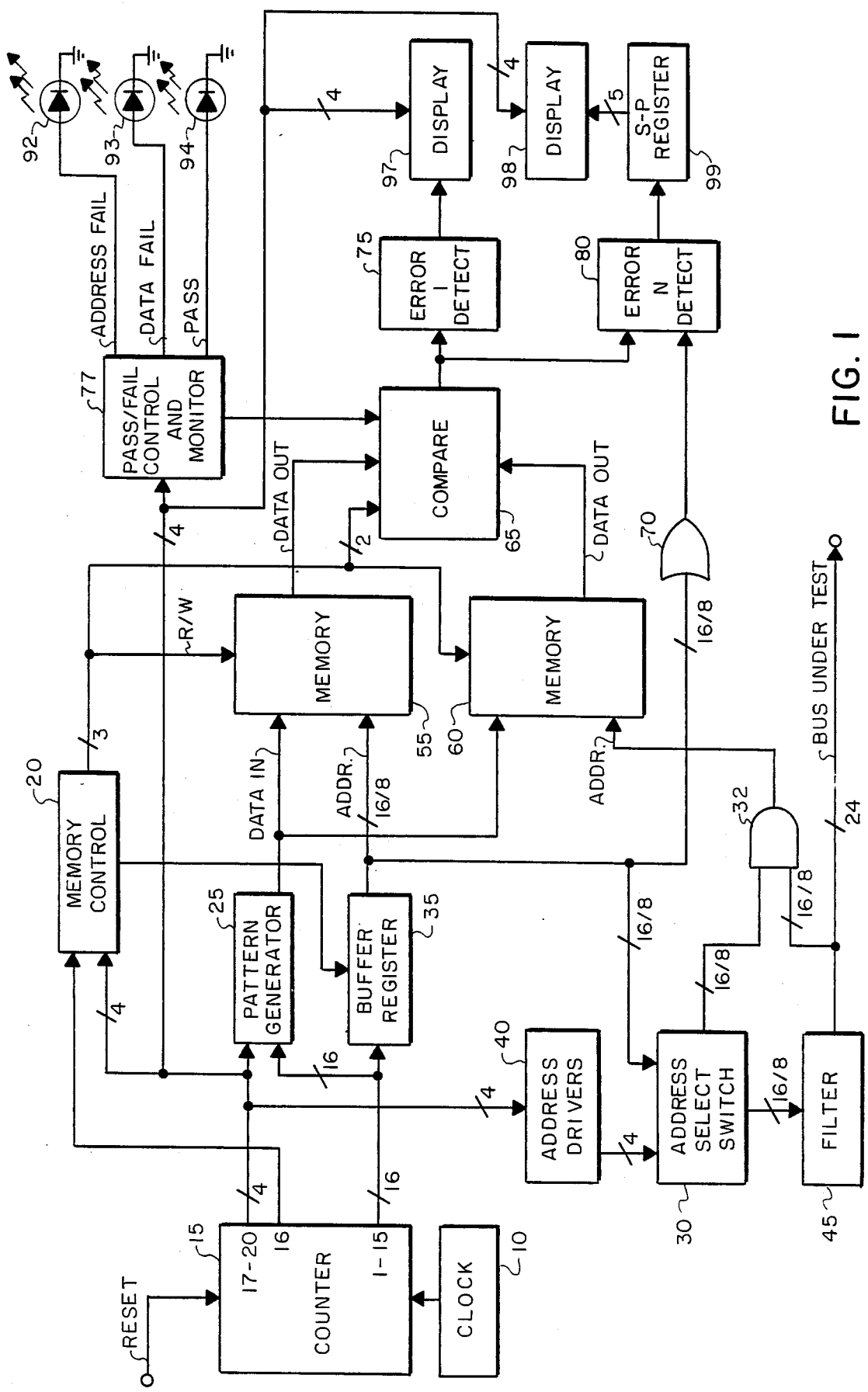
FIG. 1 is a block diagram of the circuit for testing the bus structure of a printed wiring card.

A two (2) mehahertz clock 10 is connected to counter 15 and generates all the signals of the bus testing circuit. Counter 15 is a 22 bit binary counter whose output lines 0–15 provide the pattern generator 25 with a set of address inputs. Output bits 17 through 20 of counter 15 are also connected to pattern generator 25. Bits 17 through 20 provide for selecting the pattern number which indicates the pattern input as data to memories 55 and 60 (See table 1).

Bits 0 through 15 output by counter 15 are also transmitted via connections to buffer register 35. In response to memory control 20, the outputs of buffer register 35, bits 0–15 of counter 15 which are buffered, are clocked to memory 55. The outputs of buffer register 35 are used as an input address to memory 55. Bits 17 through 20 of counter 15 are transmitted to memory control 20 and to pass/fail control and monitor 77. Bit 16 of the output of counter 15 is also transmitted to memory control 20.

The read/write signal is transmitted from memory control 20 to memories 55 and 60 via the R/W leads. This signal is derived from bit 16 of counter 15. The R/W bus is also connected to compare circuit 65.

Output bits 17 through 20 of counter 15 are transmitted to address drivers 40. Address drivers 40 provide additional drive for these signals. The output of address drivers 40 is connected to address select switch 30. Each of the leads of the particular bus under test is connected to low pass filter 45 and to AND gate 32. Address select switch 30 controls gate 32 to transmit the address or data from buffer register 35 to memory 60. Gate 32 also transmits the bus under test leads to memory 60. As it will be shown later, this combining of the address and data written to memory 60 with the address and data of the bus under test is the key to the fault detection.

Memories 55 and 60 are connected to compare circuit 65 via their respective DATA OUT leads. The address and data buses are transmitted from buffer register 35 to OR gate 70. OR gate 70 is connected to error N detect circuit 80. The output of compare circuit 65 is connected to both error 1 detect circuit 75 and to error N detect circuit 80.

OR gate 70 is a 16 input OR gate. The data and address buses are time multiplexed through it. OR gate 70 may be implemented with a number of standard integrated circuits including: a five input NAND gate integrated circuit part no. 74LS20; an OR gate part no. 74LS32; an AND gate part no. 74LS08; two NOR gates part no. 74LS02; and three four input NOR gates part no. 74LS25.

Compare circuit 65 is also connected to pass/fail control and monitor 77. Monitor 77 indicates whether the tests pass and whether the address or data bus has failed, if a failure occurs.

Counter 15 is connected via the 4-bit bus bits 17–20 to display 97. In addition, error 1 detect 75 is also connected to display 97. Error detect 75 detects the first bus shorting error and displays via display 97 the indication of the identity of this short.

Error N detect circuit 80 is connected to serial to parallel shift register 99. Detect circuit 80 detects errors in buses under test after the first error has been detected by error 1 detect circuit 75. Error and detect circuit 80 detects the next five errors. Therefore, six errors in total may be detected by this circuitry.

Serial to parallel shift register 99 is connected via a 5-bit bus to display 98. Display 98 is also connected to counter 15 via bits 1–20.

In response to the reset signal to counter 15, this circuit clears itself by zeroing out memories 55 and 60. During this process, bits 17 through 20 output by counter 15 are at logic 0 or low. As a result, the address drivers 40 and the address select switch 30 provide memories 55 and 60 with identical addresses. The data supplied during this initial write cycle is zero. Each of the 1024 locations of each memory are thereby cleared or set to zero.

During the test cycle, the connection of the bus under test will be "ANDed" with the values of the address select switch 30 by gate 32. The particular bus structure under test will be connected via low pass filter 45, through AND gate 32 to memory 60.

If two bus lines are shorted together, and a logic 0 (low or ground) is applied to one bus lead and logic 1 (high or voltage) is applied to the other lead, both shorted leads will experience a logic 0.

Because of the gating action of AND gate 32, words written to memory 60 via address select switch 30 and AND gate 32 will be affected by any shorts on the leads which comprise the bus under test. For example, if a short exists on two of the leads comprising the address portion of the bus under test, for a particular address pattern through gate 32 to memory 60, any shorted logic ones will become logic zeroes. As a result, the data will be written at the incorrect address. On subsequent comparison of memories 55 and 60 by compare circuit 65, the memories will miscompare at this particular address. Based upon the numeric value of the address of the miscomparison, a detection will be made as to which address leads are shorted. This detection will be transmitted to error 1 detect circuit 75, where it will be latched and displayed by display 97. Display 97 is the first segment of a multiple segment NIXI tube display.

For detecting errors 2 through 6, are detected by the error N detect circuit 80. The address and data bus leads are transmitted via OR gate 70 to error N detect 80 which detects errors subsequent to the first error. For each subsequent error, the identity of the shorted lead is transmitted to serial to parallel shift register 99. Each of the following five errors is transmitted to shift register 99. When all 5 errors have been detected shift register 99 transmits them to NIXI display 98.

In addition to displaying the identity of the shorted address or data bus leads, LEDS 92, 93 and 94 provide a visual indication of the status of a bus under test as either passing or failing the examination. In response to compare circuit 65, pass/fail control and monitor 77 will either light LED 94 via the pass signal or for a failure light either LED 92 or 93 corresponding to address and data lead failures via the corresponding address fail and data fail leads.

The bus under test lead is connected via a clip arrangement 100 to the particular bus structure to be tested. See FIG. 2. Several patterns are written into memories 55 and 60. Because of the connection to the bus under test through gate 32, shorts will be detected by the following process.

Bus leads that are shorted will produce the same logic value, if a signal is applied to one lead. When a logic 0 is applied to one of the short leads and a logic 1 is applied to the other of the shorted leads, the lead with the logic 1 will be "pulled down" by the shorted logic 0 lead to a logic 0. As a result, when this combination is gated through gate 32, the address bus of memory 60 will be affected and data will be written at an incorrect address. Subsequently, when compare circuit 65 compares the contents of memories 55 and 60, a miscomparison at this address will be detected and the appropriate error detector circuit enabled and its corresponding display turned on. In addition, the pass/fail control and monitor 77 will light the appropriate LED 92 through 94.

Table 1 depicts the contents of the memory 60 which result from a short on address bus leads A1 and A2. For purposes of illustration, only the first four address bits (A0–A3) of the address bus are shown.

TABLE 1

| Pattern # ... | Data In | | | | Data Out | | | |
|---|---|---|---|---|---|---|---|---|
| | 4 | 3 | 2 | 1 | | | | |
| A15 ... | A3 | A2 | A1 | A0 | 00 | 01 | 02 | 03 |
| | 0 | 0 | 0 | 0 | 0 0 0 | 0 1 0 | 0 0 1 | 0 0 0 |
| | 0 | 0 | 0 | 1 | 1 1 1 | 0 1 0 | 0 0 1 | 0 0 0 |
| | 0 | 0 | 1 | 0 | x | x | x | x |
| | 0 | 0 | 1 | 1 | x | x | x | x |
| | 0 | 1 | 0 | 0 | x | x | x | x |
| | 0 | 1 | 0 | 1 | x | x | x | x |
| | 0 | 1 | 1 | 0 | 0 | 1 | 1 | 0 |
| | 0 | 1 | 1 | 1 | 1 | 1 | 1 | 0 |
| | 1 | 0 | 0 | 0 | 0 0 0 | 0 1 0 | 0 0 1 | 1 1 1 |
| | 1 | 0 | 0 | 1 | 1 1 1 | 0 1 0 | 0 0 1 | 1 1 1 |
| | 1 | 0 | 1 | 0 | x | x | x | x |
| | 1 | 0 | 1 | 1 | x | x | x | x |
| | 1 | 1 | 0 | 0 | x | x | x | x |
| | 1 | 1 | 0 | 1 | x | x | x | x |
| | 1 | 1 | 1 | 0 | 0 | 1 | 1 | 1 |
| | 1 | 1 | 1 | 1 | 1 | 1 | 1 | 1 |

Patterns 0 and 3 ignore any shorted type faults on bus leads 1 and 2, even though certain memory locations within memory 60 are over written. Patterns 1 and 2 will detect shorts on bus leads 1 and 2. This true for either the address or data buses.

In general, if N is the number of the shorted bus element and a pattern which is not equal to N is applied to memories 55 and 60, then the data read by compare circuit 65 will be correct and it will appear that no short exists. Therefore, short type faults will be detected on bus lead N only by pattern N. There is a one to one correspondence between a pattern number and the bus lead assignment number.

When the first fault is detected by compare i circuit 65, error 1 detect circuit 75 generates a latch signal which is transmitted to display 97. Display 97 decodes and latches the value of bits 17 through 20 of counter 15. These bits correspond to the pattern number.

For succeeding faults, OR gate 70 decodes the address. Error N detect circuit 80 then provides a clock signal to serial to parallel shift register 99. The outputs of register 99 provide signals to the display circuit 98. As a result the number of each subsequent error pattern is latched and displaced by display 98.

Figure 2:
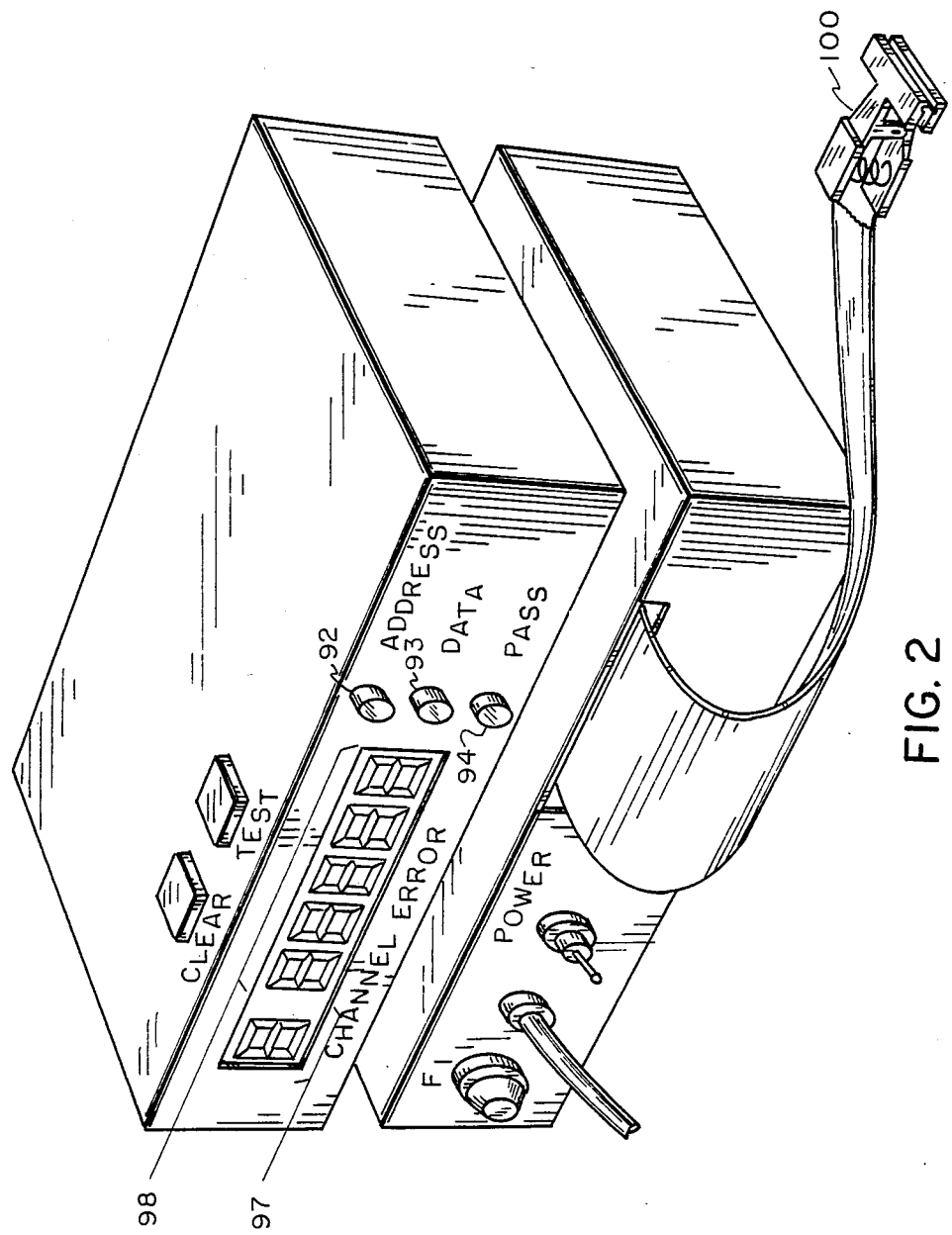
FIG. 2 is a physical layout view of the circuit and its associate apparatus for testing the bus structure of a printed wiring card.

FIG. 2 depicts a physical view of the circuitry, its housing and interface components. Clip 100 is a 40 pin integrated circuit clip mounted at one end of a 40 conductor ribbon cable. The other end of the ribbon cable is connected to the circuitry as shown in the schematic of FIG. 1, as a bus under test. Clip 100 is mounted directly on the central processor unit of the circuit to be tested. In this way, all of the address and data leads of the circuit may be transmitted to the test circuitry from a common point. The clip may be connected to any device which has all the address and data leads connected to it. The test consists of 16 patterns and is performed in two parts. The first part is the address line verification and the second part is the data line verification. This circuit contains 24 open collector test leads. Sixteen of these test leads are used for testing the address portion and eight are used for testing the data portion. However, different size address and data buses may be tested, so long as there are no more then 24 total address and data leads. This circuitry is not restricted to the particular combination of 16 address leads and 8 data leads. It is to be noted that clip 100 may not be placed to access any circuit modes which include pull up resistors. These modes would appear as high impedance links to voltage. As a result a display would incorrectly indicate these notes as being shorted leads.

Again referring to FIG. 2, to initiate the testing procedure, the power switch is turned on. Next, the clip is attached to the microprocessor of the circuit to be tested. The clip may also be attached to another device which has all the address and data leads connected to it. Then, the CLEAR switch is pushed to reset the unit. The TEST pushbutton is depressed to begin testing.

The address testing is preformed first. Then the data leads are tested. If no faults were detected, the pass LED 94 is lighted. The hexadecimal display CHANNEL ERROR is associated with the address or data lead which failed, depending on the particular LED indicator which is lit (92 or 93).

Although the preferred embodiment of the invention has been illustrated, and that form described in detail, it will be readily apparent to those skilled in the art that various modifications may be made therein without departing from the spirit of the invention or from the scope of the appended claims.

What is claimed is:

1. A circuit for testing the bus structure of a printed wiring card, said circuit comprising:
    pattern generation means being cyclically operated to produce pluralities of logic values corresponding to each lead of an address bus and a data bus;
    memory means connected to said pattern generation means via said address and data bus, said memory means being operated to store at least two copies of said pluralities of logic values at a location corresponding to each of said pluralities logic values of said address bus;
    means for connecting said bus structure of said printed wiring card to said address bus and to said data bus, said means for connection being operated to affect one copy of the logic values of said address bus corresponding to any shorted leads of said bus structure of said printed wiring card; and
    detection means connected to said pattern generation means and to said memory means, said detection means being operated to compare said two stored copies of said logic values and to indicate the identity of a plurality of shorted leads of said bus structure of said printed wiring card.

2. A circuit for testing the bus structure of a printed wiring card as claimed in claim 1, said pattern generation means including:
    clock means for producing a signal of a predetermined frequency; and
    counter means connected to said clock means and being cyclically operated to produce a first plurality of signals which indicate the address of the memory location to be written and being further operated to produce a second plurality of signals which indicate the identity of each particular lead of said address bus and said data bus.

3. A circuit for testing the bus structure of a printed wiring card as claimed in claim 2, said pattern generation means further including pattern production means connected to said counter means via a first plurality of leads and a second plurality of leads, and said pattern production means connected to said memory means via data leads, said pattern production means being operated to cyclically produce predetermined data patterns corresponding to each address input via said first plurality of leads and to transmit said data patterns to said memory means for storage via said data leads.

4. A circuit for testing the bus structure of a printed wiring card as claimed in claim 3, said pattern generation means further including:
    driver means connected to said second plurality of leads and being operated to retransmit said second plurality of signals; and
    switching means connected to said first plurality of leads and to said data leads, said switching means being operated to transmit said first plurality of signals and said data signals to said memory means.

5. A circuit for testing the bus structure of a printed wiring card as claimed in claim 4, wherein there is further included buffering means connected to said counter means, to said memory means, to said switching means and to said detection means, said buffering means being operated to retransmit said first plurality of signals to said memory means and to said switching means.

6. A circuit for testing the bus structure of a printed wiring card as claimed in claim 5, said memory means including memory control means connected to said counting means via said first and second plurality of leads, to said buffering means, said memory control means being operated to produce a plurality of memory control signals including a memory read/write signal.

7. A circuit for testing the bus structure of a printed wiring card as claimed in claim 6, said memory means further including first memory device means connected to said pattern production means, to said memory control means and to said buffering means, said first memory device means being operated in response to said memory read/write signal of said memory control means to store said data patterns of said pattern production means at the address of said first plurality of signals.

8. A circuit for testing the bus structure of a printed wiring card as claimed in claim 7, said memory means further including second memory device means connected to said memory control means, to said pattern production means and to said means for connecting, said second memory device means being operated in response to said read/write signal of said memory control means to store said data patterns at the affected address location.

9. A circuit for testing the bus structure of a printed wiring card as claimed in claim 8, said means for connecting including low pass filter means connected to said switching means and to said bus structure of said printed wiring card, said low pass filter means being operated to remove high frequency noise from each of the signals of said bus structure of said printed wiring card.

10. A circuit for testing the bus structure of a printed wiring card as claimed in claim 9, said means for connecting further including gating means connected to said switching means, to said low pass filter means, to said bus structure of said printed wiring card and to said second memory device means said gating means being operated to combine said transmitted address of said buffering means with said bus structure of said printed wiring card and to transmit said combined address to said second memory device means.

11. A circuit for testing the bus structure of a printed wiring card as claimed in claim 10, said gating means including AND gating means.

12. A circuit for testing the bus structure of a printed wiring card as claimed in claim 11, said detection means including comparison means connected to said first and second memory device means and to said memory control means, said comparison means being operated in response to said memory control means to compare the contents of corresponding locations of said first and second memory device means and to produce an error indication for a miscomparison of any locations corresponding.

13. A circuit for testing the bus structure of a printed wiring card as claimed in claim 12, said detection means further including first error detection means connected to said comparison means and being operated to store an indication of a first detected error indication.

14. A circuit for testing the bus structure of a printed wiring card as claimed in claim 13, said detection means further including second error detection means connected to said comparison means and being operated to store up to five additional detected error indications subsequent to said first detected error indication.

15. A circuit for testing the bus structure of a printed wiring card as claimed in claim 14, said detection means further including second gating means connected between said buffering means and said second error detection means, said second gating means being operated to combine said first plurality of address leads.

16. A circuit for testing the bus structure of a printed wiring card as claimed in claim 15, said second gating means including OR gating means.

17. A circuit for testing the bus structure of a printed wiring card as claimed in claim 16, said detection means further including monitor means connected to said counter means and to said comparison means, said monitor means being operated to produce an address fail signal, a data fail signal and an all test pass signal.

18. A circuit for testing the bus structure of a printed wiring card as claimed in claim 17, 1 wherein there is further included first display means connected to said first error detection means and to said counter means via said second plurality of signals, said first error detection means being operated to display the identity of a first shorted lead.

19. A circuit for testing the bus structure of a printed wiring card as claimed in claim 18, wherein there is further included:
register means connected to said second error detection means, said register means being operated to store up to five detected error indications; and
second display means connected to said register means and being operated to display up to five said detected error indications.

20. A circuit for testing the bus structure of a printed wiring card as claimed in claim 19, wherein there is further included:
third display means connected to said monitor means and being operated in response to said address fail signal to indicate visually the failure of an address lead of said printed wiring card;
fourth display means connected to said monitor means and being operated in response to said data fail signal to produce a visual indication of a failure of a data lead of said printed wiring card; and
fifth display means connected to said monitor means via said all tests pass signal and being operated to visually display an indication that said address and data tests have been successfully completed.

21. A circuit for testing the bus structure of a printed wiring card as claimed in claim 20, said means for connecting further including:
attachment means being selectively connectable to components of said printed wiring card having connections to said address and to said data buses; and
cable means connected between said attachment means and said low pass filter means for transmitting each of said address and data bus signals to said low pass filter means.

22. A circuit for testing the bus structure of a printed wiring card as claimed in claim 21, wherein there is further included enclosure means for containing said circuit for testing the bus structure of a printed wiring card.

* * * * *